(12) United States Patent
Coppola et al.

(10) Patent No.: US 6,747,479 B1
(45) Date of Patent: Jun. 8, 2004

(54) INTERFACE SCHEME FOR CONNECTING A FIXED CIRCUITRY BLOCK TO A PROGRAMMABLE LOGIC CORE

(75) Inventors: Alan J. Coppola, Portland, OR (US); Joel Stanley, Urbana, IL (US); Steven J. E. Wilton, Vancouver (CA)

(73) Assignee: Cypress Semiconductor Corp., San Jose, CA (US)

( * ) Notice: Subject to any disclaimer, the term of this patent is extended or adjusted under 35 U.S.C. 154(b) by 269 days.

(21) Appl. No.: 10/011,696

(22) Filed: Dec. 5, 2001

(51) Int. Cl.[7] .......................................... H03K 19/177
(52) U.S. Cl. ............................. 326/41; 326/39; 326/40
(58) Field of Search ...................................... 326/38–41

(56) References Cited

U.S. PATENT DOCUMENTS

| 5,682,107 | A |   | 10/1997 | Tavana et al. ............... 326/41 |
| 5,874,834 | A | * | 2/1999 | New ............................ 326/39 |
| 5,880,598 | A |   | 3/1999 | Duong ......................... 326/41 |
| 6,020,755 | A | * | 2/2000 | Andrews et al. ............... 326/39 |
| 6,064,599 | A |   | 5/2000 | Cliff et al. .............. 365/189.01 |
| 6,094,065 | A |   | 7/2000 | Tavana et al. ................. 326/39 |
| 6,150,837 | A | * | 11/2000 | Beal et al. .................... 326/39 |
| 6,204,689 | B1 |   | 3/2001 | Percey et al. ................. 326/41 |

OTHER PUBLICATIONS

Alan Coppola et al., "Interface Scheme for Connecting a Fixed Circuitry Block to a Programmable Logic Core", U.S. patent application Ser. No. 10/011,936, Filed Dec. 5, 2001.

\* cited by examiner

Primary Examiner—Vibol Tan
(74) Attorney, Agent, or Firm—Christopher P. Maiorana, P.C.

(57) ABSTRACT

An apparatus comprising one or more configurable interface tiles. The configurable interface tiles may be configured to communicate one or more signals between one or more programmable logic cores and one or more fixed function cores. The one or more configurable interface tiles, the one or more programmable logic cores and the one or more fixed function cores may be integrated on a single chip.

20 Claims, 6 Drawing Sheets

INTERFACE SCHEME FOR CONNECTING A FIXED CIRCUITRY BLOCK TO A PROGRAMMABLE LOGIC CORE

CROSS-REFERENCE TO RELATED APPLICATIONS

The present invention may relate to co-pending application Ser. No. 10/011,936, filed concurrently, which is hereby incorporated by reference in its entirety.

FIELD OF THE INVENTION

The present invention relates to a method and/or architecture for interfacing fixed circuitry blocks to programmable logic blocks generally and, more particularly, to an architecture and/or method for implementing a set of configurable interface tiles that may be configured to interface fixed circuitry blocks to programmable logic blocks without modifying the fixed circuitry blocks or the programmable logic blocks.

BACKGROUND OF THE INVENTION

As programmable logic devices are migrated to more advanced technologies, the integration of fixed function blocks (called cores) onto the same device (or in the same package) as programmable logic may become commonplace. The fixed function blocks are different than programmable logic in that the fixed function cores are designed to perform a specific function and are not programmable. However, the fixed function cores can be significantly faster and consume a smaller area than the same function implemented using programmable logic. In the past, the fixed circuitry blocks have been relatively small, such as memory blocks or multiplier blocks. However, in order to provide the performance demanded by programmable logic device customers, larger and more capable fixed function cores may be needed.

Existing programmable logic devices (PLDs) with embedded fixed function cores (FFCs) rely on ad-hoc techniques to connect the FFC to a programmable logic core (PLC). Typically, interface circuitry is embedded in either the fixed function cores or the programmable logic core. As an example, U.S. Pat. No. 6,064,599 describes a fixed memory array that can be embedded into a programmable logic device. The interface circuitry, as well as dedicated connections used to interconnect neighboring memory arrays is described as part of the memory arrays themselves. In another example, U.S. Pat. No. 6,204,689 describes input/output blocks, where the interconnect between the input/output blocks and the programmable logic is embedded within the programmable logic.

The conventional methods of interfacing FFCs with PLCs involve including the interface circuitry as part of either the fixed function core or the programmable logic core. While including the interface circuitry as part of the FFC is acceptable for very small FFCs (such as memories), implementing the interface circuitry as part of the FFC is not feasible for large FFCs. Often, the FFCs were originally designed and sold as stand-alone chips. Including interface circuitry within the stand alone cores can require a significant redesign effort. Similarly, including the interface circuitry in the PLC can require a redesign of the PLC every time a new fixed-function core is to be integrated. Typically, a family of hybrid devices can contain members that differ in the amount of programmable logic on the chip. Using the conventional ad-hoc interconnection techniques, the interconnect needs to be redesigned for each family member. Redesigning each family member can be unfeasible (cost prohibitive).

It would be desirable to have a structured method and/or architecture for integrating fixed-function and programmable logic cores that does not require the modification of either core.

SUMMARY OF THE INVENTION

The present invention concerns an apparatus comprising one or more configurable interface tiles. The configurable interface tiles may be configured to communicate one or more signals between a programmable logic core and a fixed function core. The one or more configurable interface tiles, the programmable logic core and the fixed function core may be integrated on a single chip.

The objects, features and, advantages of the present invention include providing configurable interface tiling that may (i) provide a set of configurable interface tiles (CITs) that may be used to interconnect a fixed function core and a programmable logic core on an integrated circuit, (ii) provide a method for constructing an integrated circuit containing one or more fixed function cores, one or more programmable logic cores, and one or more configurable interface tiles, and/or (iii) allow the coupling of fixed function cores and programmable logic cores on an integrated circuit without the cores being modified.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 1:
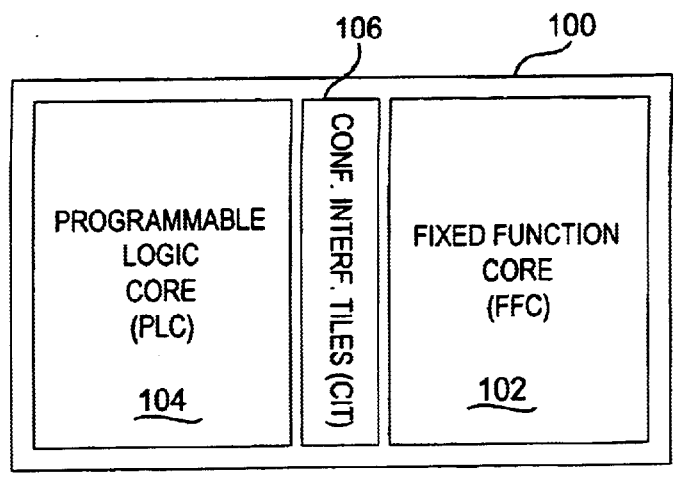
FIG. 1 is a block diagram of a preferred embodiment of the present invention.

Referring to FIG. 1, a block diagram of a circuit 100 is shown illustrating a preferred embodiment of the present invention. The circuit 100 may comprise a fixed function core (FFC) 102, a programmable logic core (PLC) 104 and an interface block 106. The interface block 106 may be implemented with configurable interface tiles (CITs), examples of which are described in more detail in connection with FIGS. 6–8. The structure of the circuitry within the CITs may be configured to be flexible enough to implement all necessary connections between the PLC 104 and the FFC 102. Also, the interface block (circuit) 106 may be configured so as not to (i) consume more chip area than necessary and/or (ii) delay the signals connecting the two cores more than is necessary. In one example, the FFC 102 may be configured to operate at a higher clock rate than the PLC 104. The interface circuitry 106 may be configured to provide a reliable bridge between the two clock domains. The present invention generally provides a set of configurable interface tiles that can be used to construct the interface 106, and a method for constructing a programmable device containing such a CIT interface.

U.S. Pat. Nos. 5,682,107 and 5,880,598 disclose the use of "tiles" in the design of a programmable logic device. As used herein, a tile is a portion of an integrated circuit that is generally designed once, and replicated many times, to produce the final device. The use of tiles may significantly reduce the design-time of the programmable logic devices, since each tile needs to be designed only once. In U.S. Pat. No. 5,682,107, the tiles consist of logic elements and programmable routing tracks. In U.S. Pat. No. 5,880,598, additional tiles are described which supplement the existing routing tracks with additional routing tracks in areas of a chip where routing congestion is expected. The present invention generally provides a new set of cores, implemented as tiles, that may be used in conjunction with the tiles described above, to create a programmable logic device with one or more fixed-function cores.

Figure 2:
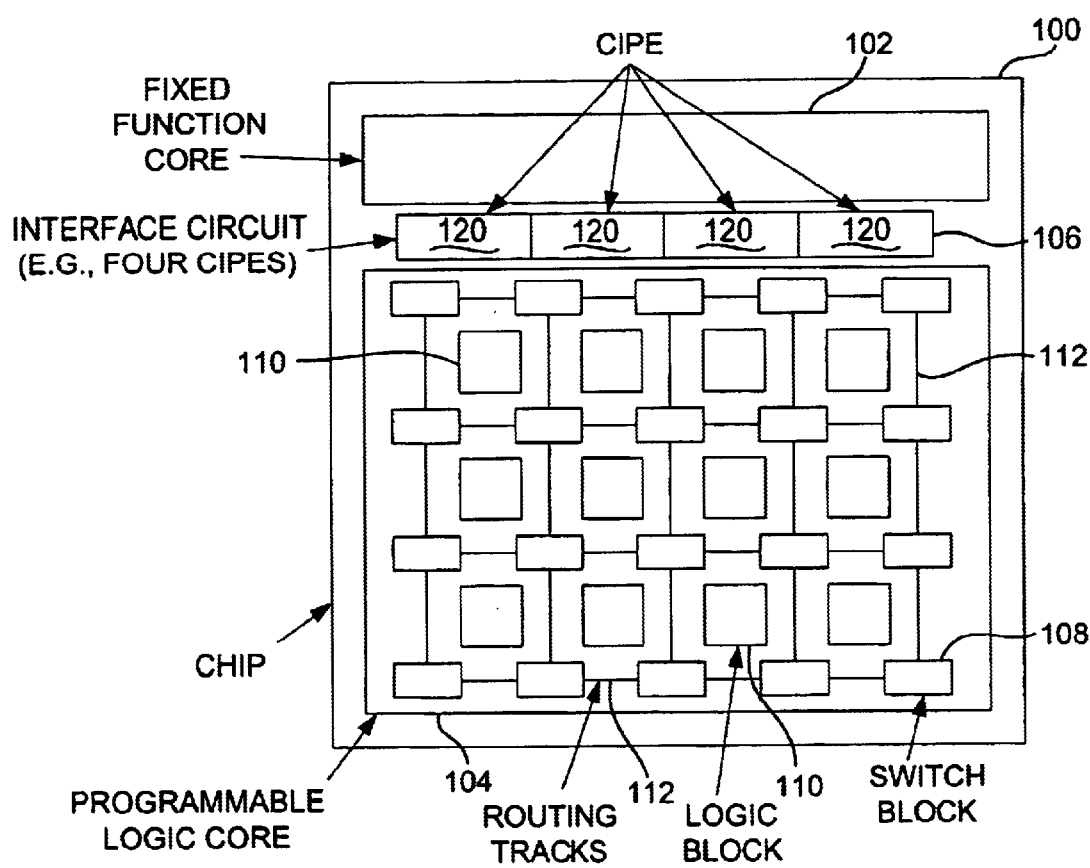
FIG. 2 is a detailed block diagram of a circuit 100 of FIG. 1.

Referring to FIG. 2, a more detailed block diagram of the circuit 100 is shown. The programmable logic core (PLC) 104 may comprise switch blocks 108, logic blocks 110, and routing tracks 112. However, other programmable logic core architectures may be implemented accordingly to meet the design criteria of a particular application. The fixed function core (FFC) 102 may be implemented as a non-programmable block of circuitry that performs a single function (e.g., a serializer/deserializer, memory, transceiver, etc.). The interface block (circuit) 106 may be constructed by selecting a number of configurable interface tiles (CITs) for providing signal paths between the PLC 104 and the FFC 102. The FFC 102 may span a number of logic blocks of the PLC 104 (e.g., 4 logic blocks). In general, the interface circuit 106 may comprise a number of cluster interface pin elements (CIPEs) 120 equal to or less than the number of logic blocks spanned by the FFC 102 (e.g. the interface circuit 106 may have 4 CIPEs 120 when the FFC 102 spans 4 logic blocks 110). In general, different fixed function cores 102 may span a different number of logic blocks. When the fixed function core 102 spans m logic blocks, where m is an integer, the interface generally contains no more than m CIPEs 120.

Figure 3:
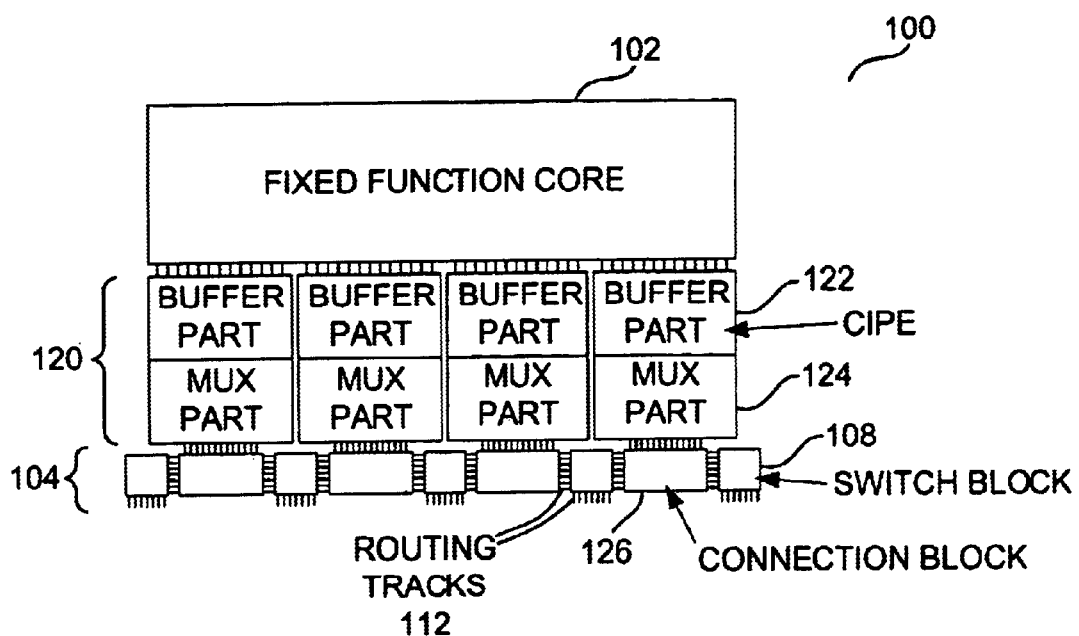
FIG. 3 is a more detailed block diagram of interconnection CIPEs of FIG. 2.

Referring to FIG. 3, a more detailed block diagram of the circuit 100 of FIG. 2 is shown. Each CIPE 120 may comprise a buffer part (circuit) 122 and a multiplexer (MUX) part (circuit) 124. The buffer part 122 may be coupled to the FFC 102. The multiplexer part 124 may be coupled to the PLC 104. In one example, the multiplexer part 124 may be coupled to the PLC 104 via a connection block (circuit) 126. The connection block 126 may be connected to the switch blocks 108 and/or the routing tracks 112 of the PLC 104. Each CIPE 120 may be configured to couple a number of signals between the FFC 102 and the PLC 104. The number of signals coupled by each CIPE may be varied to meet the design criteria of a particular implementation.

Figure 4:
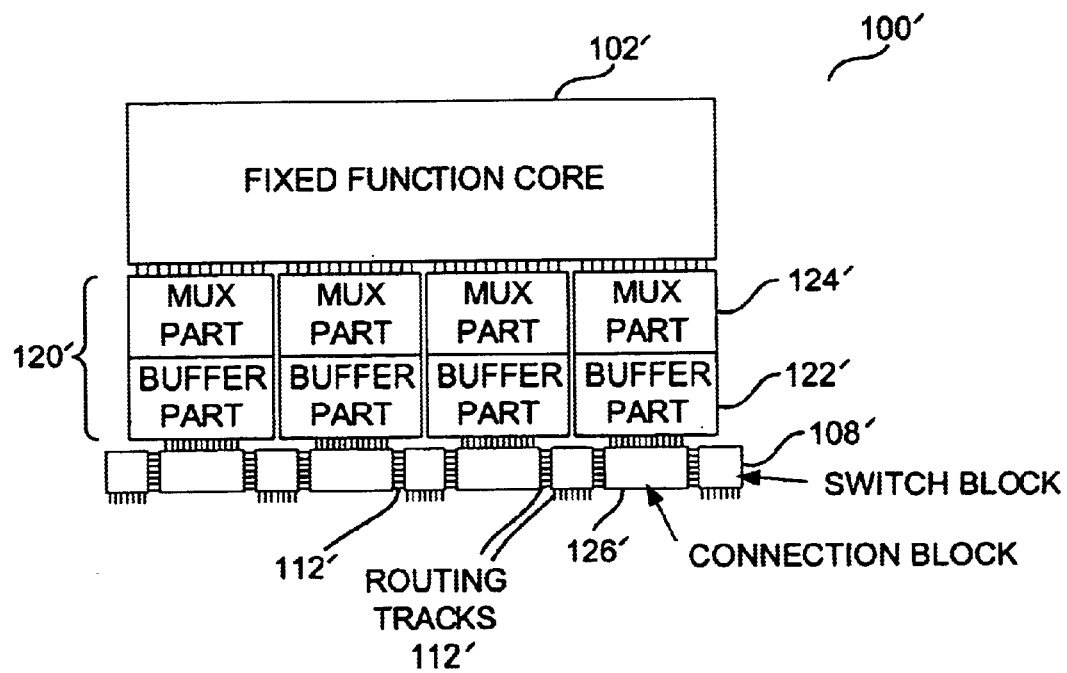
FIG. 4 is a detailed block diagram of an alternative embodiment of the interconnection CIPEs of FIG. 2.

Referring to FIG. 4, a detailed block diagram of a circuit 100' is shown illustrating an alternative embodiment of the circuit 100 of FIG. 2. The circuit 100' may comprise a number of CIPEs 120'. Each CIPE 120' may comprise a buffer part (circuit) 122' and a multiplexer (MUX) part (circuit) 124'. The buffer part 122' may be coupled to the PLC 104'. The multiplexer part 124' may be coupled to the FFC 102'. In one example, the buffer part 122' may be coupled to the PLC 104 via a connection block (circuit) 126'. The connection block 126' may be connected to a switch blocks 108' and/or routing tracks 112' of the PLC 104'. However, a combination of the embodiments of FIGS. 3 and 4 may be implemented accordingly to meet the design criteria of a particular application.

Figure 5:
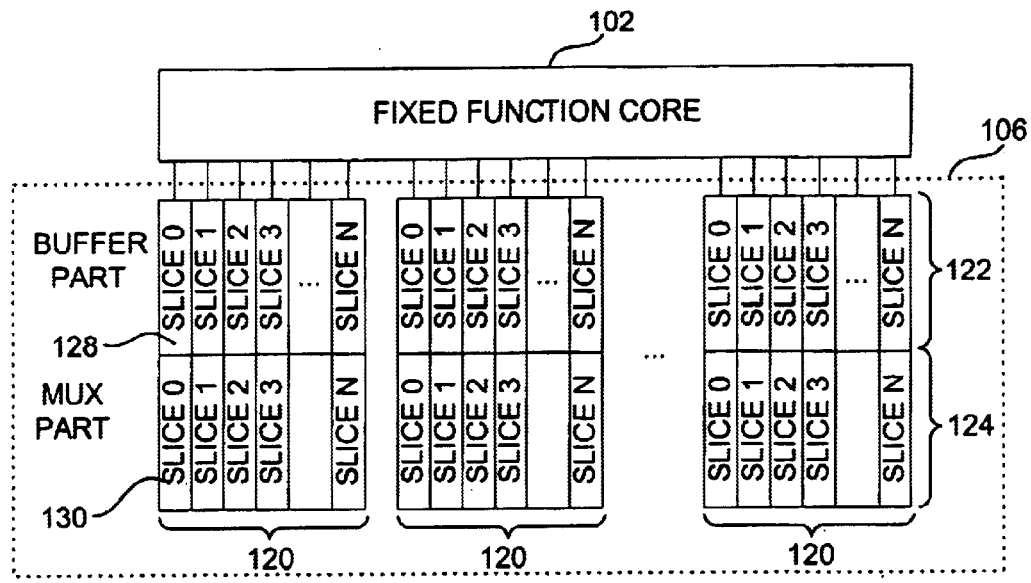
FIG. 5 is a more detailed block diagram of a CIPE of FIG. 3.
Figure 6A:
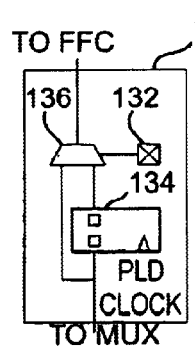
FIGS. 6(a–f) are block diagrams of buffer tiles of FIG. 5.
Figure 6B:
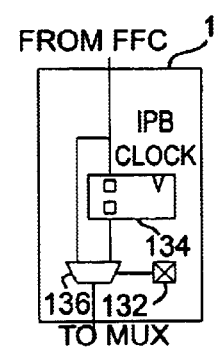
Figure 6C:
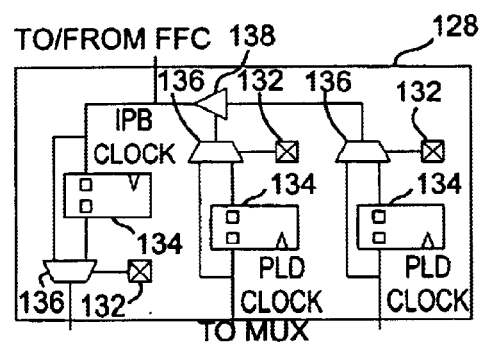
Figure 6D:
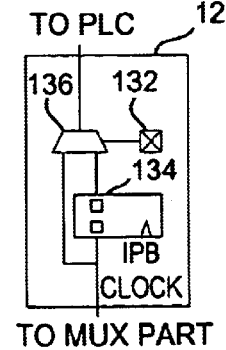
Figure 6E:
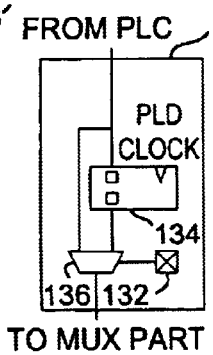
Figure 6F:
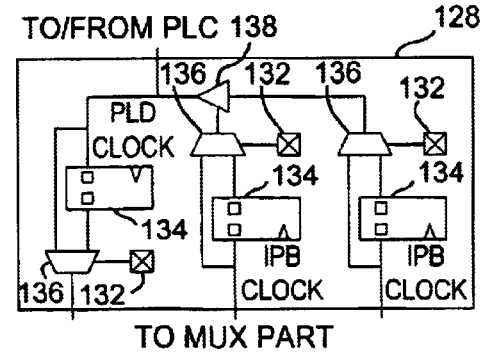

Referring to FIG. 5, a more detailed block diagram of an interface block 106 of FIG. 3 is shown. Each buffer part 122 and multiplexer part 124 may comprise a number of slices 128 and 130, respectively. Each of the slices 128 generally has a corresponding slice 130. Each pair of slices 128i and 130i generally corresponds to a single input/output pin (connection) of the fixed function core 102.

The present invention generally provides a family of tiles for implementing the slices 128 and 130. However, a single tile may, in accordance with the present invention, implement a pair of slices 128 and 130. In general, an appropriate slice tile may be chosen for each fixed function core pin, depending on the function of the pin (e.g., whether the pin is an input, an output, or a bi-directional pin). In general, the slice tiles are different from I/O pad buffer circuits that need to be flexible enough to support many different modes and standards (e.g., LVDS, etc.). In general, once the fixed function core is chosen and glued to the programmable logic core, the function of each pin as an input, an output, or a bi-directional pin is generally fixed.

In general, the present invention may classify pins in two orthogonal ways. First, each pin may be classified by function (e.g., an input, an output, a bi-directional pin, etc.). Second, each pin may be classified by speed. For example, each pin may operate at a speed that either matches the speed of the programmable logic core, or that is some multiple or fraction of the programmable logic core speed. When the classification of the pins of the FFC 102 is determined, particular slice tiles may be selected for implementing the slices 128 and 130. The CIPEs 120' of FIG. 4 may be implemented similarly with buffer slices 128' and multiplexer slices 130'.

Referring to FIGS. 6(a–f), block diagrams are shown illustrating example slice tile architectures for implementing a buffer slice 128 or 128' for input pins (FIGS. 6a and 6d), output pins (FIGS. 6b and 6e), and bi-directional pins (FIGS. 6c and 6f), where the pins operate at substantially the same speed as the PLC 104. In general, one of the tiles may be selected for each pin, depending on whether the pin is an input of the FFC (or PLC), an output of the FFC (or PLC), or a bi-directional connection between the FFC and the PLC. Each tile generally comprises one or more configuration bits 132 (e.g., indicated by a square containing an X in the FIGS. 6(a–f)), one or more registers 134, and one or more multiplexers 136. The bi-directional tiles (FIGS. 6c and 6f) may further comprise a controllable buffer 138.

The configuration bits 132 may be set (programmed) to either a logical 0 or a logical 1 when, in one example, the PLC 104 is configured. The configuration bits 132 are generally one-time programmable. However, the configuration bits 132 may be implemented such that the end user of the device may change the programming similarly to the configuration bits in the PLC 104. The configuration bits 132 generally allow a user to select whether the communication paths between the FFC 102 and the PLC 104 are registered or not registered.

Referring to FIGS. 6(*a*) and 6(*d*), the tiles 128 and 128' may receive one or more signals from a multiplexer part. The signals may be presented to an input of the register 134 and a first input of a multiplexer 136. The register 134 may be clocked by a clock of the PLC 104 (e.g., PLD_CLOCK) when the tile is presenting a signal to the FFC 102 and by a clock of the FFC 102 (e.g., IPB_CLOCK) when the tile is presenting a signal to the PLC 104. An output of the register 134 may be presented to a second input of the multiplexer 136.

Referring to FIGS. 6(*b*) and 6(*e*), the tiles 128 and 128' may receive one or more signals from either the FFC 102 or the PLC 104. The signals may be presented to an input of the register 134 and a first input of the multiplexer 136. The register 134 may be clocked by the signal IPB_CLOCK or the signal PLD_CLOCK depending on whether the signals are received from the FFC 102 or the PLC 104.

Referring to FIGS. 6(*c*) and 6(*f*), the tiles 128 and 128' may receive signals from either the FFC 102 or the PLC 104 and a multiplexer part. Each of the registers 134 may be clocked by a clock signal associated with the source of signals received at a D-input of the register. For example, when the register 134 receives signals from the FFC 102, the register 134 may be clocked by the signal IPB_CLOCK. Alternatively, a register 134 receiving signals from the PLC 104 may be clocked by the signal PLD_CLOCK.

Figures 7A, 7B, 7C:
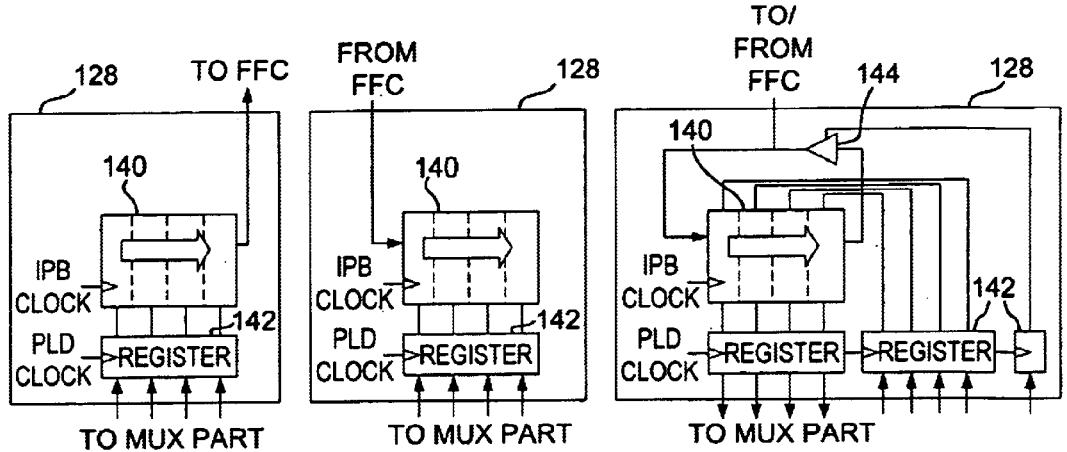
FIGS. 7(a–f) are block diagrams of buffer tile architectures with serial/parallel converters.
Figures 7D, 7E, 7F:
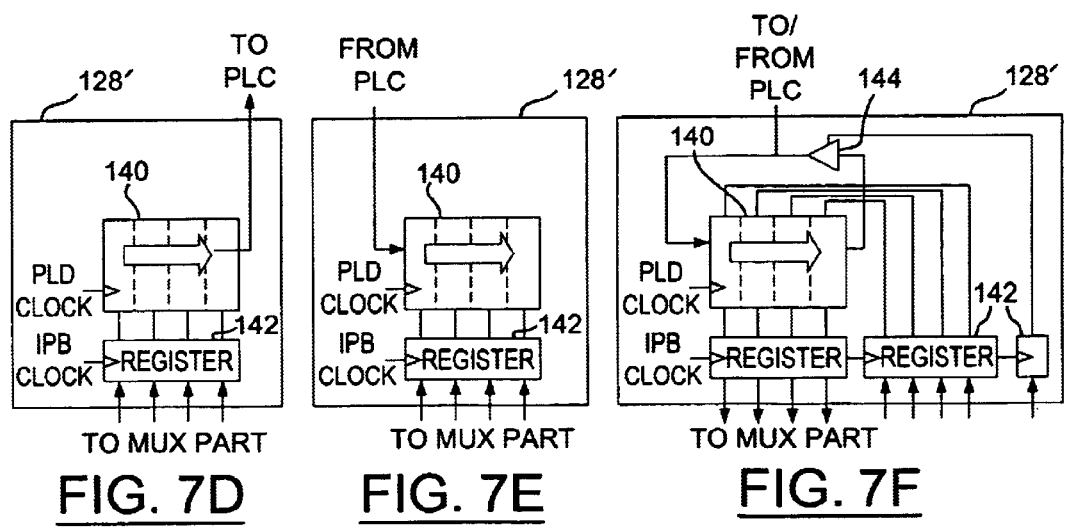

Referring to FIGS. 7(*a–f*), block diagrams are shown illustrating example slice tile architectures for implementing buffer slices 128 and 128' for input pins (FIGS. 7*a* and 7*d*), output pins (FIGS. 7*b* and 7*e*) and bi-directional pins (FIGS. 7*c* and 7*f*), where the pins operate at a multiple or a fraction of the speed of the PLC 104. Each of the tiles (circuits) generally comprises a parallel-to-serial converter 140 and one or more registers 142. The bi-directional tiles (FIGS. 7*c* and 7*f*) may further comprise a controllable buffer 144. The parallel-to-serial converters 140 are generally configured to receive/present a serial signal from/to either the FFC 102 (FIGS. 7*a*–7*c*) or the PLC 104 (FIGS. 7*d*–7*f*) and present/receive a set of parallel signals to/from a multiplexer part of the CIPE 120. Alternatively, the parallel-to-serial converters 140 may be configured to convert a set of parallel signals from/to either the FFC 102 or the PLC 104 to a serial signal to/from a multiplexer part of the CIPE 120.

Referring to FIGS. 7(*a–c*), when the tiles are configured to present signals to the FFC 102, the registers 142 are generally clocked by the signal PLD_CLOCK and the parallel-to-serial converters 140 are generally clocked by the signal IPB_CLOCK. Referring to FIGS. 7(*d–f*), when the tiles are configured to present signals to the PLC 104, the registers 142 are generally clocked by the signal IPB_CLOCK and the parallel-to-serial converters are generally clocked by the signal PLD_CLOCK.

Figure 8A:
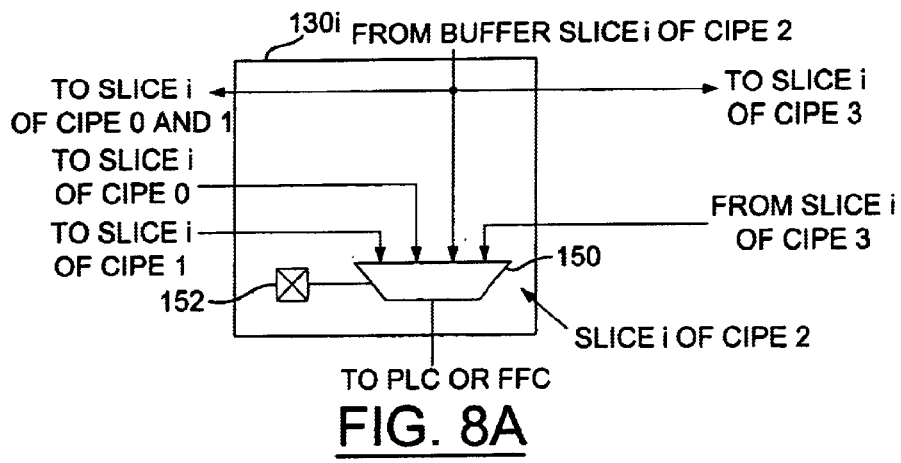
FIGS. 8(a–c) are detailed block diagrams of tile architectures for implementing multiplexer slices of FIG. 5.
Figure 8B:
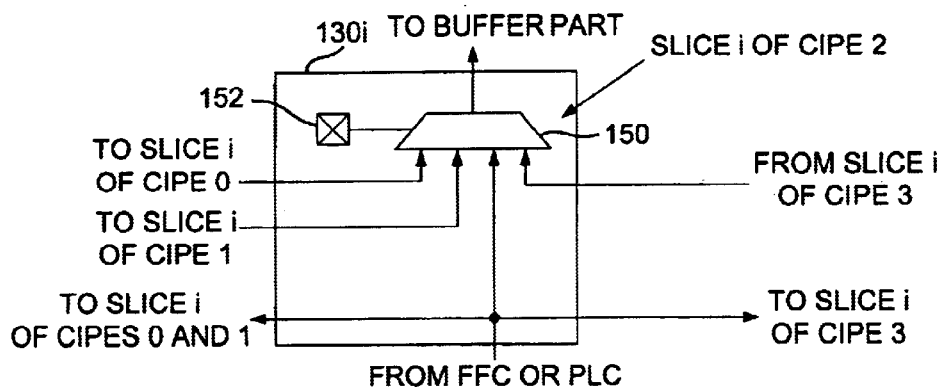
Figure 8C:
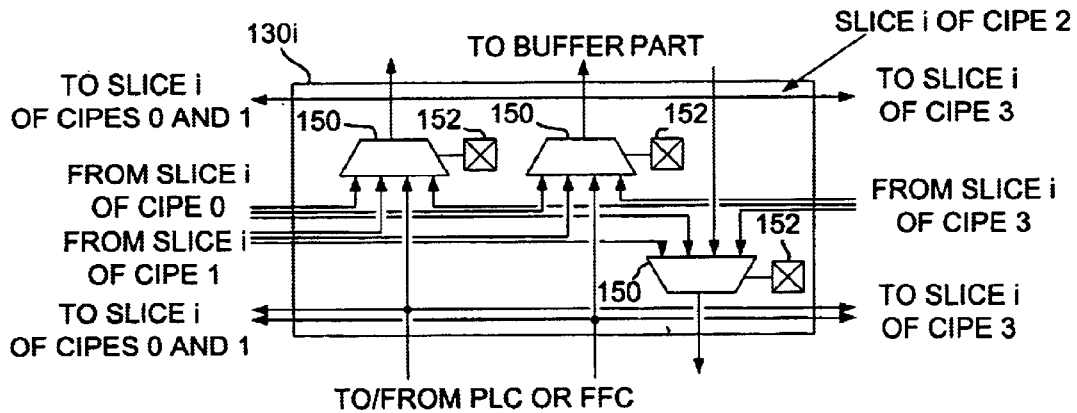

Referring to FIGS. 8(*a–c*), more detailed block diagrams are shown illustrating example slice tile architectures for implementing a multiplexer slice 130 or 130' for an input pin (FIG. 8*a*), an output pin (FIG. 8*b*) and a bi-directional pin (FIG. 8*c*), where m=4. The multiplexer slices 130 and 130' may comprise one or more multiplexers 150 and one or more configuration bits 152. The multiplexer slice tile may be configured to select a signal from an ith slice 128 of each CIPE 120 connected to the FFC 102. In an example where four CIPEs are connected to the FFC 102, an input to the multiplexer slice 130*i* from the buffer slice 128*i* of the second CIPE may be presented also to the multiplexer slices 130*i* of the first, third and fourth CIPEs 120. The example may be extended to any m by implementing a larger multiplexer. In one example, configuration bits 152 may be used to control each multiplexer 150 (e.g., $\log_2(m)$ bits are generally needed per tile). The configuration bits 152 may be set (programmed) when the PLC 104 is configured. Alternatively, the configuration bits 152 may be permanently set as part of the design of the whole device.

When m is large (e.g., greater than 8), the outlined scheme may result in excessively large multiplexers 150. For example, when the FFC 102 spans 16 logic blocks, a 16 input multiplexer would be needed. When the multiplexers 150 are excessively large, connections between the FFC 102 and the PLC 104 may be slow. However, fewer connections may be provided in each tile to allow implementation of smaller multiplexers. In the example above, the 16-input multiplexer may be replaced, in one example, by an 8-input multiplexer with inputs taken from only half of the CIPEs 120. Smaller multiplexers may be implemented accordingly to meet the design criteria of a particular application.

The multiplexer slices 130 and 130' may be configured to flexibly connect the buffer slices 128 and 128' to the programmable logic core 104 and the fixed function core 102, respectively. Providing a single access point for each FFC pin may provide insufficient routability. However, when too much flexibility is provided, the connection may be slow. In general, a compromise that balances between flexibility and speed may be chosen. For example, an interface circuit 106 for a FFC 102 that spans m logic blocks of the programmable logic core 104, where m is small (e.g., 8 or less), may provide m access points to each pin (e.g., one access point per logic block in the PLC). For example, one m-input multiplexer per FFC pin may be implemented with an input received from each CIPE.

The present invention may provide a method for constructing a programmable logic device with a fixed function core connected by one or more of the tiles described above. The method may be summarized using the following steps: (1) select a pre-designed fixed function core (FFC) and a pre-designed programmable logic core (PLC); (2) for each pin of the fixed function core, select one or more configurable interface tiles (CIT) including one buffer slice and one multiplexer slice; (3) implement an integrated circuit containing the FFC, the PLC, and the selected CITs. The particular tile or tiles selected may depend on whether the FFC pin is an input, an output or bi-directional. Further selection may be based on whether the pin operates at the same speed as the programmable logic core, or operates at some multiple or fraction of the programmable logic speed.

Figure 9:
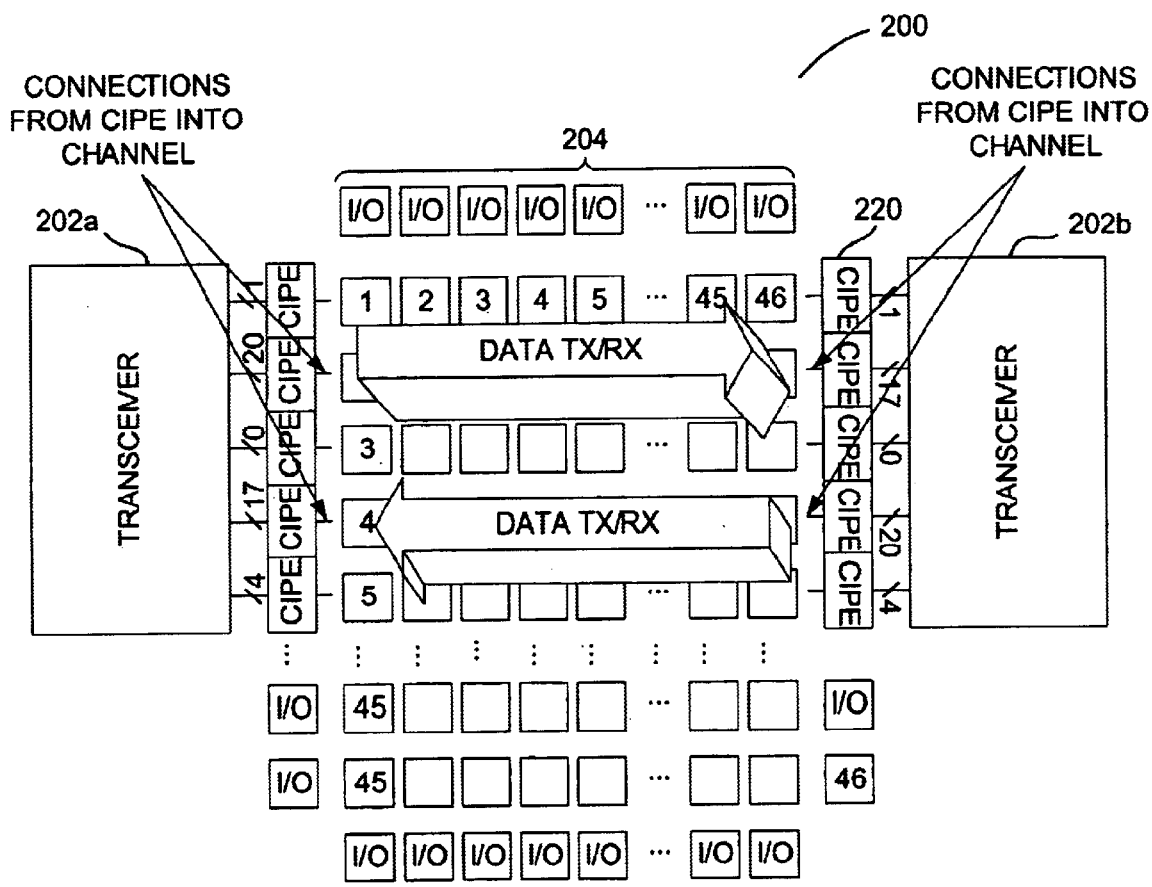
FIG. 9 is a block diagram illustrating an example integration of two fixed-function cores and a programmable logic core.

Referring to FIG. 9, a block diagram of a circuit 200 is shown. The circuit 200 generally illustrates an example device implemented in accordance with the present invention. In one example, two fixed function cores (FFCS) 202*a* and 202*b* may be integrated onto the same chip as a programmable logic core 204. The FFCs 202*a* and 202*b* may be implemented, in one example, as SONET OC-48 transceivers. A number of CIPE blocks 220 may be configured to interconnect the fixed function cores 202*a* and 202*b* and the programmable logic core 204.

As described above, existing programmable logic devices with embedded fixed function cores rely on ad-hoc techniques to connect the fixed function cores (FFC) to the programmable logic core (PLC). The ad-hoc techniques require the redesign of either the FFC or the PLC, which can take a significant amount of time. The present invention generally does not require the redesign of either the FFC or the PLC. Instead, the pre-designed FFC and PLC may be placed on the chip, and interface tiles selected in accordance with the present invention may be configured to connect the FFC and the PLC.

The design-time of such integrated circuits may be significantly improved (reduced). In addition, the present invention may allow new parts containing new FFCs to quickly and easily be produced as new market opportunities are uncovered. As the integration of fixed-function cores and programmable logic cores on the same integrated circuit becomes commonplace, one of the most difficult aspects of performing the integration may be the interface between the fixed and programmable logic. The present invention may provide a simple yet effective solution to the problem. For example, the present invention may provide a configurable physical connection between fixed and programmable logic and solve clock domain synchronization problems.

The present invention may provide an interface block comprising one or more tiles that may contain serial/parallel interfaces along with input, output, and/or bi-directional pin support. The present invention may provide a method for constructing a device including the steps of: (i) selecting one or more pre-designed fixed-function cores, (ii) selecting one or more pre-designed programmable logic cores, (iii) selecting one or more tiles from a set of configurable interface tiles and (iv) integrating the cores and tiles on a chip.

While the invention has been particularly shown and described with reference to the preferred embodiments thereof, it will be understood by those skilled in the art that various changes in form and details may be made without departing from the spirit and scope of the invention.

What is claimed is:

1. An apparatus comprising:
   one or more configurable interface tiles configured to communicate one or more signals between a programmable logic core and a fixed function core, wherein said one or more configurable interface tiles, said programmable logic core and said fixed function core are integrated on a single chip and at least one of said one or more configurable interface tiles comprises a buffer section configured to present a signal as registered or unregistered.

2. The apparatus according to claim 1, wherein each of said one or more configurable interface tiles comprises at least one section selected from the group consisting of (i) a multiplexer section, (ii) a buffer section, and (iii) a multiplexer and buffer section.

3. The apparatus according to claim 2, wherein said multiplexer section comprises an input multiplexer.

4. The apparatus according to claim 2, wherein said multiplexer section comprises an output multiplexer.

5. The apparatus according to claim 2, wherein said multiplexer section comprises an input multiplexer and an output multiplexer.

6. The apparatus according to claim 2, wherein said multiplexer section comprises an input multiplexer, an output multiplexer and an output-enable multiplexer.

7. The apparatus according to claim 1, wherein said buffer section further comprises a parallel-to-serial converter.

8. The apparatus according to claim 7, wherein said parallel-to-serial converter is configured to receive a set of parallel signals from a multiplexer section and present a serial signal to one of said fixed function cores.

9. The apparatus according to claim 7, wherein said parallel-to-serial converter is configured to receive a set of parallel signals from one of said fixed function cores and present a serial signal to a multiplexer section.

10. The apparatus according to claim 7, wherein said parallel-to-serial converter is configured to receive a serial signal from one of said fixed function cores and present a set of parallel signals to a multiplexer section.

11. The apparatus according to claim 7, wherein said parallel-to-serial converter is configured to receive a serial signal from a multiplexer section and present a set of parallel signals to said programmable logic core.

12. The apparatus according to claim 7, wherein:
   said parallel-to-serial converter is configured to (i) bi-directionally communicate with said multiplexer section via a parallel interface and (ii) bi-directionally communicate with one of said fixed function cores via a serial interface.

13. The apparatus according to claim 7, wherein:
   said parallel-to-serial converter is configured to (i) bi-directionally communicate with said programmable logic core via a parallel interface and (ii) bi-directionally communicate with a multiplexer section via a serial interface.

14. The apparatus according to claim 1, wherein said buffer section comprises an input circuit configured to present an input signal to said fixed function core in response to an output signal from said programmable logic core, wherein said input signal is registered in response to a first state of a control signal and unregistered in response to a second state of said control signal.

15. The apparatus according to claim 1, wherein said buffer section comprises an output circuit configured to present an input signal to said programmable logic core in response to an output signal from said fixed function core, wherein said input signal is registered in response to a first state of a control signal and unregistered in response to a second state of said control signal.

16. The apparatus according to claim 1, wherein said buffer section comprises an input/output circuit configured to (i) present a registered or unregistered input to a multiplexer circuit in response to an input signal from said fixed function core and (ii) present a registered or unregistered output to one of said fixed function cores in response to an output signal and an enable signal from a multiplexer section.

17. A method for constructing a device comprising the steps of:
   (A) selecting one or more pre-defined fixed-function cores;
   (B) selecting one or more pre-defined programmable logic cores;
   (C) selecting a plurality of configurable interface tiles, wherein (i) a first configurable interface tile comprises a multiplexer part, (ii) a second configurable interface tile comprises a buffer part and (iii) said configurable interface tiles are configured to couple signals between said fixed-function cores and said programmable logic cores; and
   (D) integrating said one or more fixed function cores, said one or more programmable logic cores and said configurable interface tiles on a single chip.

18. The method according to claim 17, wherein step (D) comprises the steps of:
   coupling said multiplexer part to said buffer part;
   coupling said multiplexer part to one of said one or more programmable logic cores; and
   coupling said-buffer part to one of said one or more fixed-function cores.

19. The method according to claim 17, wherein step (D) comprises the steps of:

coupling said multiplexer part to said buffer part;
coupling said buffer part to one of said one or more programmable logic cores; and
coupling said multiplexer part to one of said one or more fixed-function cores.

20. An apparatus comprising:
one or more configurable interface tiles configured to communicate one or more signals between a programmable logic core and a fixed function core, wherein said one or more configurable interface tiles, said programmable logic core and said fixed function core are integrated on a single chip and at least one of said one or more configurable interface tiles comprises a buffer section comprising a parallel-to-serial converter.

* * * * *